(12) United States Patent
Raneri

(10) Patent No.: US 7,890,288 B1
(45) Date of Patent: Feb. 15, 2011

(54) TIMING FUNCTIONS TO OPTIMIZE CODE-EXECUTION TIME

(75) Inventor: Michael Joseph Raneri, Bethlehem, PA (US)

(73) Assignee: Anadigics, Inc., Warren, NJ (US)

( * ) Notice: Subject to any disclaimer, the term of this patent is extended or adjusted under 35 U.S.C. 154(b) by 519 days.

(21) Appl. No.: 11/982,786

(22) Filed: Nov. 5, 2007

(51) Int. Cl.
*G06F 19/00* (2006.01)
*G06F 17/40* (2006.01)

(52) U.S. Cl. ............ 702/123; 73/865.9; 324/500; 324/537; 702/117; 702/182

(58) Field of Classification Search .......... 73/865.8, 73/865.9; 324/73.1, 500, 537, 754, 765; 702/1, 57, 64, 108, 117, 119, 123, 124, 125, 702/126, 127, 182, 187, 189; 712/220; 713/1, 713/2, 100, 375, 400, 401; 717/100; 718/100, 718/107

See application file for complete search history.

(56) References Cited

U.S. PATENT DOCUMENTS

| | | | | |
|---|---|---|---|---|
| 2,950,437 A * | 8/1960 | Stahl | ................ | 324/73.1 |
| 2,996,666 A * | 8/1961 | Baker | ................ | 324/73.1 |
| 3,082,374 A * | 3/1963 | Buuck | ................ | 324/73.1 |
| 3,219,927 A * | 11/1965 | Topp, Jr. et al. | ................ | 714/735 |
| 3,237,100 A * | 2/1966 | Chalfin et al. | ................ | 324/108 |
| 3,522,532 A * | 8/1970 | McCoy | ................ | 324/73.1 |
| 4,497,056 A * | 1/1985 | Sugamori | ................ | 714/736 |
| 5,613,062 A * | 3/1997 | Hasebe et al. | ................ | 714/37 |
| 5,717,704 A * | 2/1998 | Rosenfeld | ................ | 714/736 |
| 6,377,901 B1 * | 4/2002 | List et al. | ................ | 702/119 |
| 6,418,391 B1 * | 7/2002 | Umezu et al. | ................ | 702/123 |
| 6,479,983 B1 * | 11/2002 | Ebiya | ................ | 324/158.1 |
| 6,549,000 B2 * | 4/2003 | Ebiya | ................ | 324/158.1 |
| 6,895,548 B2 * | 5/2005 | Kitada et al. | ................ | 714/815 |
| 6,990,613 B2 * | 1/2006 | Doi et al. | ................ | 714/700 |
| 7,286,950 B2 * | 10/2007 | Ozora et al. | ................ | 702/108 |
| 7,707,000 B2 * | 4/2010 | Baney et al. | ................ | 702/118 |
| 2002/0045997 A1* | 4/2002 | List et al. | ................ | 702/125 |
| 2002/0100000 A1* | 7/2002 | Kitada et al. | ................ | 714/815 |
| 2002/0186003 A1* | 12/2002 | Ebiya | ................ | 324/158.1 |
| 2002/0190706 A1* | 12/2002 | Ebiya | ................ | 324/158.1 |
| 2004/0251914 A1* | 12/2004 | Doi et al. | ................ | 324/537 |
| 2006/0036389 A1* | 2/2006 | Ozora et al. | ................ | 702/108 |
| 2008/0263411 A1* | 10/2008 | Baney et al. | ................ | 714/47 |

* cited by examiner

*Primary Examiner*—Edward R Cosimano
(74) *Attorney, Agent, or Firm*—William L. Botjer

(57) ABSTRACT

A method and system for optimizing a test plan of an Integrated Circuit (IC). The test plan includes two or more test sequences. A test sequence includes the measurement of a parameter of the IC. The total test time of the IC is reduced by performing one or more activities during a desired wait time associated with the measurement of the parameter. The test plan may be further optimized by modifying the one or more activities performed during the desired wait time.

8 Claims, 8 Drawing Sheets

TIMING FUNCTIONS TO OPTIMIZE CODE-EXECUTION TIME

BACKGROUND

The present invention generally relates to the testing of Integrated Circuits (ICs). More specifically, the present invention relates to methods and systems for optimizing a test plan for testing ICs.

ICs must be tested for their functionality and their compliance to required specifications. The total test time of an IC depends on a number of factors. Firstly, it is affected by the time required by the functional elements within the IC to settle into a particular mode of operation. The total test time is also affected by the time required to configure test-voltage supplies, relay matrices, signal generators, measurement instruments, and the like. Moreover, the total test time includes the time taken to transfer test data between the IC and a host computer through a communication medium such as a communication bus or a General Purpose Interface Bus (GPIB). Repetitive measurements of various parameters of the IC, such as voltage, current, frequency, RF power, noise, etc., also contribute to the total test time.

Test software used to test ICs use delays during the execution of a test plan. Delays are used to account for the time taken (hereinafter referred to as the desired wait time) by the measurement instrument to stabilize, the time taken to configure different test parameters and components, and the like. For example, a test plan may require a voltage source to change its output voltage to a specified voltage level. Once the test plan triggers the voltage source to change the voltage, the voltage source takes a certain amount of time to stabilize at the specified voltage level. A reliable measurement of a parameter may not be possible until the voltage source settles down at the specified voltage level. Hence, a test plan developer usually inserts a delay in the test plan, to account for the stabilizing time of the voltage source.

In another example, a delay may be required to account for the time needed by a measurement instrument to stabilize after the measurement range of the measurement instrument is changed. In yet another example, a delay may be required for functional elements within the IC to settle down. For example, the test plan may instruct a Phase Locked Loop (PLL) within an IC, to change a frequency of an internal Voltage Controlled Oscillator (VCO). Accordingly, a delay needs to be introduced, to account for the time taken by the PLL to stabilize the VCO to the required frequency.

The total test time of an IC is largely affected by the delay timings used in the test plan. For example, a test plan of an IC may require an RF measurement to be performed on one of its pins. An RF measurement instrument, used to perform the RF measurement, may take a definite amount of time to stabilize before it can perform a reliable measurement on the pin. Therefore, the test plan includes a delay of a time period equal to the stabilizing time required by the RF measurement instrument. The instruction in the test plan, corresponding to performing the RF measurement, is executed only after the time period corresponding to the delay has elapsed.

During the delay, no other activity is performed. A large number of delays, introduced in testing, may therefore result in an increase in the total test time of the IC. Further, when a plurality of ICs is being tested in a test assembly, the total test time of the plurality of ICs may increase significantly. An increase in the total test time directly affects the cost of the IC, as the total test time of the IC is directly related to its cost.

In light of the foregoing discussion, there is a need for efficiently utilizing delay timings in a test plan for an IC, to reduce the total test time. Moreover, there is a need for an optimized test plan that is capable of reducing the overall test time of a plurality of ICs.

SUMMARY

An object of the present invention is to reduce the total test time of an IC by performing one or more activities during a desired wait time associated with the measurement of a parameter of the IC.

Another object of the present invention is to optimize a test plan for an IC, by modifying one or more activities being performed during a desired wait time associated with the measurement of a parameter of the IC.

To achieve the objectives mentioned above, various embodiments of the present invention provide a method for executing a test sequence on an IC. The test sequence includes the measurement of a parameter of the IC. A desired wait time is associated with the measurement of the parameter. In an embodiment of the present invention, the test sequence initializes the measurement of the parameter. One or more activities are performed during the desired wait time. The measurement of the parameter is performed at the end of the desired wait time.

In another embodiment of the present invention, a delay time is logged after the measurement of the parameter is performed. The delay time is equal to the difference between the desired wait time and the time that has elapsed in performing the one or more activities. The test sequence may be modified, based on the delay time. Modifying the test sequence may involve replacing an activity from the test sequence by another activity, inserting an activity in the test sequence, adjusting various attributes of an activity in the test sequence, or removing an activity from the test sequence.

In the execution of a test plan, the delay timings associated with various test sequences may be logged and compared with each other to determine an optimized test sequence as well as an optimized test plan of the IC.

In various embodiments of the invention, various attributes of an activity may be adjusted. The number of measurement samples of a parameter of an IC may be modified by increasing the number of measurement samples or decreasing them. Further, the resolution of a measurement instrument may be adjusted. Also, the delay time associated with an activity may be modified. These adjustments may be performed by a test plan developer or may be executed automatically by test software.

The total test time of an IC is considerably reduced by performing one or more activities during the desired wait time associated with the measurement of a parameter of the IC. Further, executing an optimized test plan, according to various embodiments of the invention, on a batch of ICs significantly reduces the total test time of the batch. Moreover, the optimized test plan provides highly reliable test results by facilitating an increase in the accuracy of test results over repetitive measurements.

BRIEF DESCRIPTION OF THE DRAWINGS

Various embodiments of the invention will hereinafter be described in conjunction with the appended drawings, provided to illustrate and not to limit the invention, wherein like designations denote like elements, and in which.

DESCRIPTION OF PREFERRED EMBODIMENTS

Various embodiments of the present invention provide a method for optimizing a test plan for testing an Integrated Circuit (IC). A test plan for an IC may include two or more test sequences. A test sequence may include performing a measurement of a parameter of the IC. A desired wait time may be associated with the measurement of the parameter. While executing the test sequence on the IC, one or more activities may be performed during the desired wait time. The measurement of the parameter is performed at the end of the desired wait time. A delay time is calculated, which is the difference between the desired wait time and the time that has elapsed in performing the one or more activities. The delay time calculated may be used to modify the test sequence or the test plan of the IC. Further, the delay time may be used to adjust various attributes of an activity to better utilize the delay time.

Figure 1:
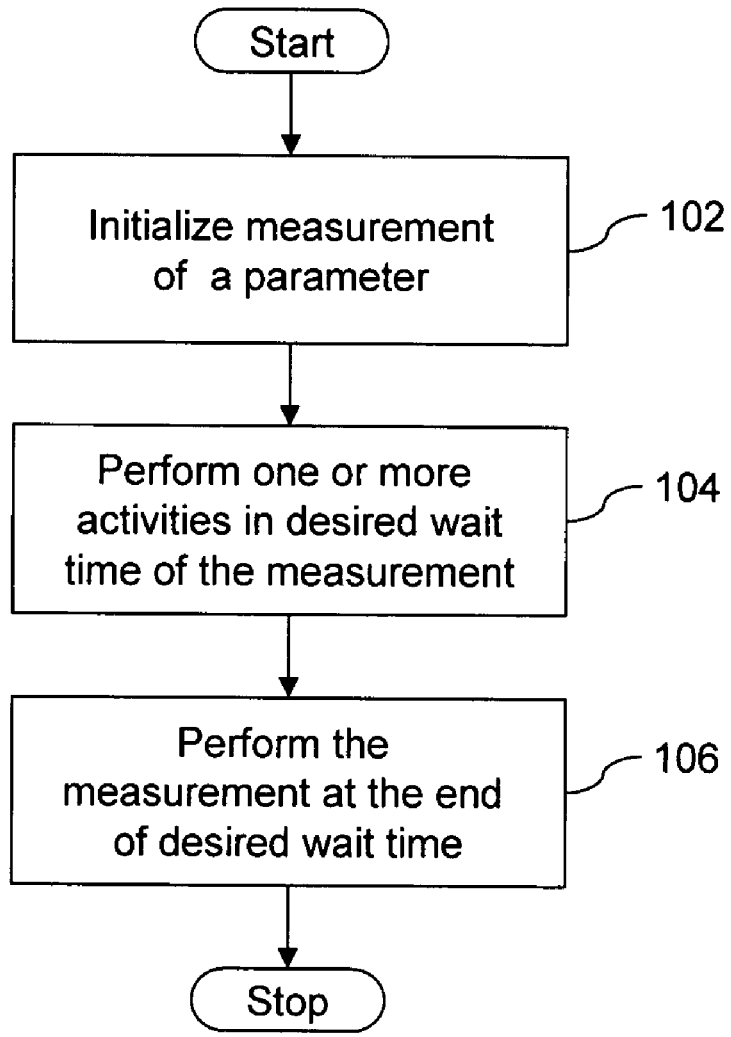
FIG. 1 is a flowchart illustrating a method for executing a test sequence on an Integrated Circuit (IC), in accordance with an embodiment of the invention.

FIG. 1 is a flowchart illustrating a method for executing a test sequence on an Integrated Circuit (IC), in accordance with an embodiment of the invention. At step 102, the measurement of a parameter of an IC is initialized. In various embodiments of the invention, the parameter may be a voltage, current, frequency, radio frequency (RF) power, and the like. In various embodiments of the invention, initializing the measurement of the parameter may include changing the bias voltage of a pin of the IC, changing the frequency of a Phase Locked Loop (PLL) within the IC, initializing the measurement instrument, and the like.

In various embodiments of the invention, some time may be required by a measurement instrument to settle down after initialization, a changed bias voltage to stabilize, a PLL to stabilize a frequency of a Voltage-Controlled Oscillator (VCO) within the IC, and the like, referred to as a desired wait time.

At step 104, one or more activities are performed during the desired wait time. In various embodiments of the invention, the one or more activities may be independent from the measurement initialized. In various embodiments of the invention, the one or more activities may include performing the measurement of one or more other parameters of the IC, transferring data between the IC or a measurement instrument and a host computer through a communication medium, processing the data on the host computer, configuring a measurement instrument, executing another test sequence on the IC, and the like. The communication medium may be any communication bus, a General Purpose Interface Bus (GPIB), Universal Serial Bus (USB), and the like. At step 106, the parameter is measured at the end of the desired wait time.

In various embodiments of the present invention, performing the measurement of the parameter may include measuring a predetermined number of samples of the parameter. For example, performing the measurement may include measuring predefined samples of voltage on a certain pin of the IC at predefined time intervals. In various embodiments of the present invention, automated test software may execute the test sequence on the IC.

Figure 2:
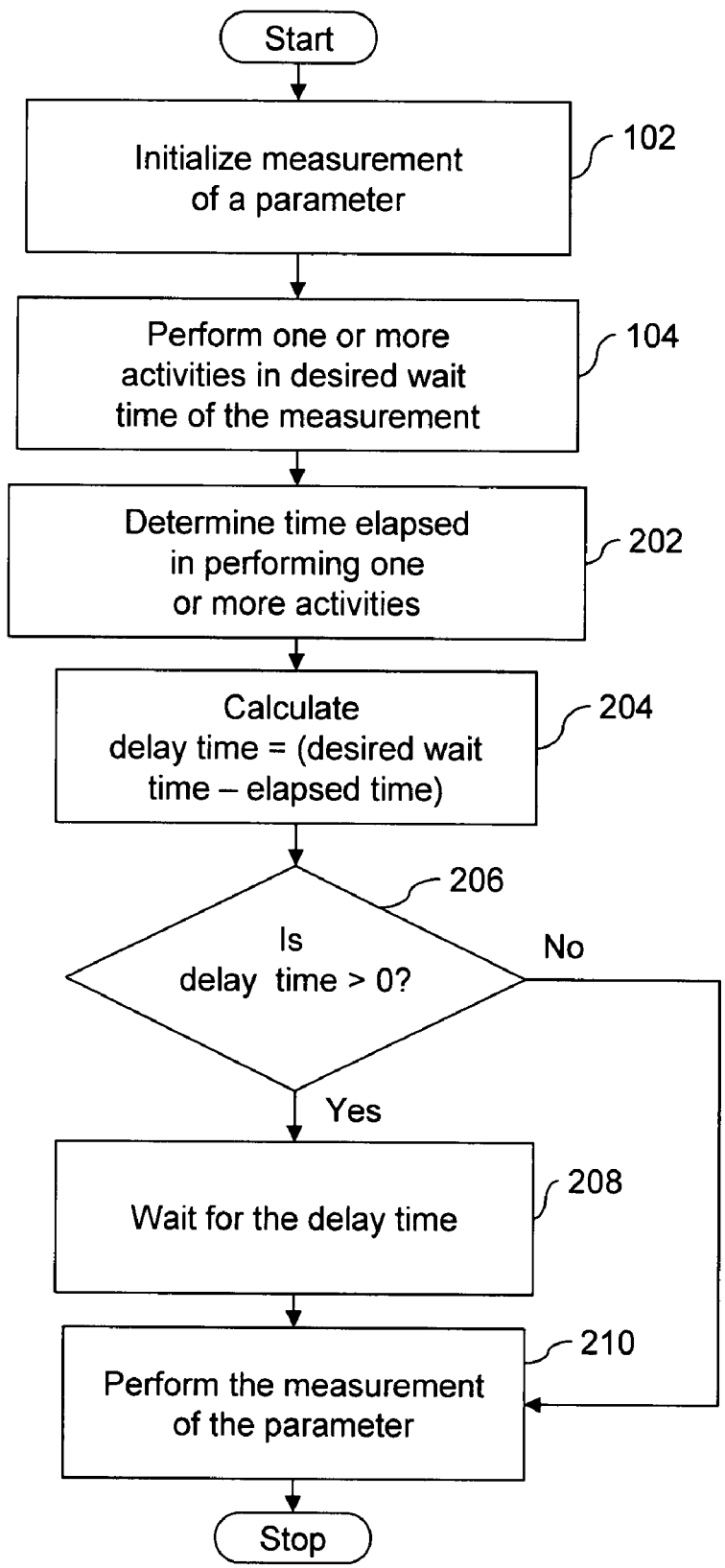
FIG. 2 is flowchart illustrating a method for utilizing a desired wait time associated with the measurement of a parameter in a test sequence, in accordance with an embodiment of the invention.

FIG. 2 is a flowchart illustrating a method for utilizing a desired wait time associated with the measurement of a parameter in a test sequence, in accordance with an embodiment of the invention. At step 102, the measurement of a parameter of an IC is initialized. At step 104, one or more activities are performed in the desired wait time. In various embodiments of the invention, the one or more activities may be independent from the measurement initialized. Steps 102 and 104 have been explained in detail in conjunction with FIG. 1.

At step 202, the time that has elapsed in performing the one or more activities is determined. At step 204, a delay time is calculated. The delay time is equal to the difference between the desired wait time associated with the measurement of the parameter and the time that has elapsed in performing the one or more activities. At step 206, a check is performed to determine whether the delay time calculated is greater than zero. If it is determined that the delay time is equal to or less than zero, step 210 is performed. At step 210, the measurement of the parameter is performed. If it is determined at step 206 that the delay time is greater than zero, step 208 is performed. At step 208, a delay is executed, i.e., a delay of a time period that is equal to the delay time is inserted into the test sequence. Thereafter, at step 210, the measurement of the parameter is performed.

In various embodiments of the invention, a check may be performed to determine whether the ratio of delay time, calculated at step 206, to the desired wait time is greater than a predetermined value. If the ratio is greater than the predetermined value, step 208 may be performed. If the ratio is less than or equal to the predetermined value, step 210 may be performed.

In various embodiments of the invention, automated test software may execute delays in the test sequence of the IC.

In an embodiment of the invention, the measurement of a second parameter may be interwoven with the measurement of a first parameter. A first desired wait time and a second desired wait time may be associated with the measurement of the first parameter and the second parameter respectively. The measurement of the first parameter may be initialized first. Thereafter, the measurement of the second parameter may be initialized during the first desired wait time. The measurement of the first parameter may be performed at the end of the first desired wait time and the measurement of the second parameter may be performed at the end of the second desired wait time.

Figure 3:
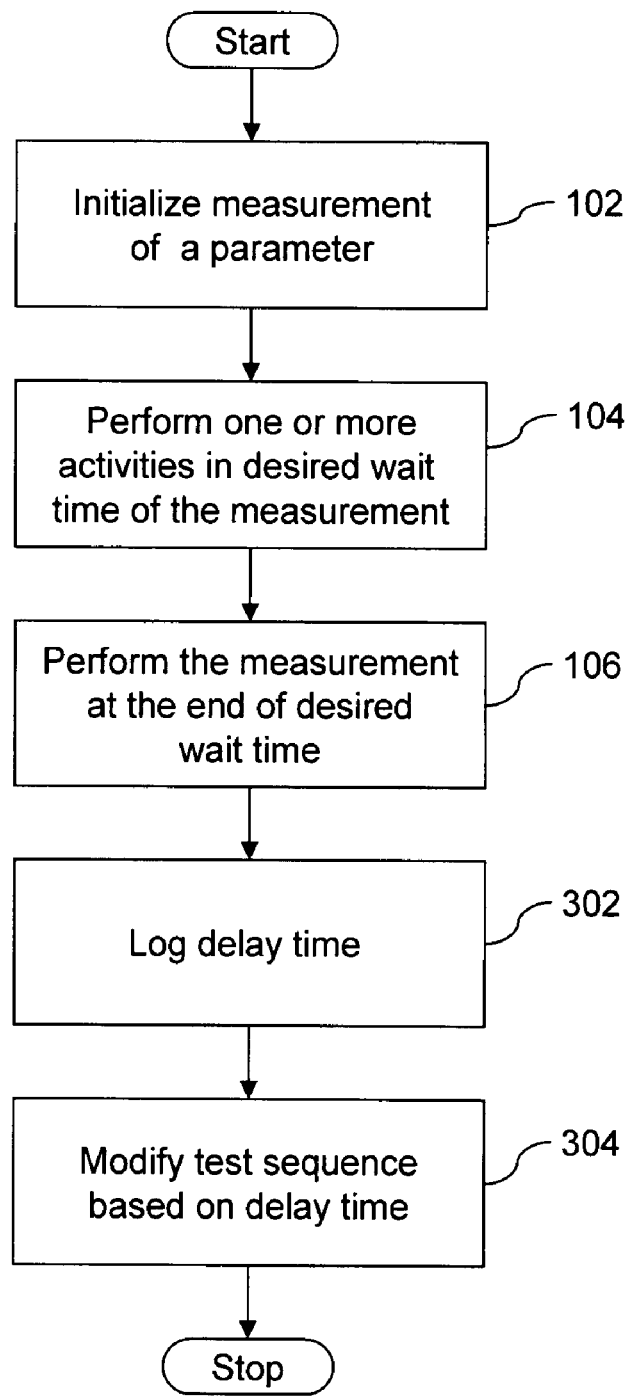
FIG. 3 is flowchart illustrating a method for modifying a test sequence of an IC, in accordance with an embodiment of the invention.

FIG. 3 is a flowchart illustrating a method for modifying a test sequence of an IC, in accordance with an embodiment of the invention. At step 102, the measurement of a parameter of the IC is initialized. At step 104, one or more activities are performed during the desired wait time. At step 106, the parameter is measured at the end of the desired wait time. Steps 102, 104, and 106 have been explained in detail in conjunction with FIG. 1.

At step 302, a delay time is logged. The delay time represents the difference between the desired wait time and the time that has elapsed in performing the one or more activities. At step 304, the test sequence of the IC is modified, based on the delay time logged.

In various embodiments of the invention, the test sequence may be modified by replacing an activity from the test sequence by another activity, inserting an activity in the test sequence, removing an activity from the test sequence, adjusting various attributes of an activity, and the like. For example, the number of measurement samples of a parameter of an IC may be modified. Further, the resolution of a measurement instrument may be adjusted. Also, the delay time associated with an activity may be modified. These adjustments may be performed by a test plan developer or may be executed automatically by test software.

In various embodiments of the invention, the delay time logged may be used to modify the test sequence. If it is determined that the delay time is greater than zero, a test plan developer may choose to insert another activity in the test sequence, so that a greater number of activities may be performed during the desired wait time.

Alternatively, the test plan developer may choose to replace an activity in the test sequence with another activity. If it is determined that the delay time is less than zero, the test developer may choose to remove an activity from the test sequence, or replace an activity by another activity. If it is determined that the delay time is equal to zero, the test sequence would not be modified by the test plan developer.

In an embodiment of the invention, a test sequence may be executed on an IC and modified iteratively. In another embodiment of the invention, a test sequence may be executed on an IC. Thereafter, the test sequence may be modified and subsequently executed on another IC.

Figure 4:
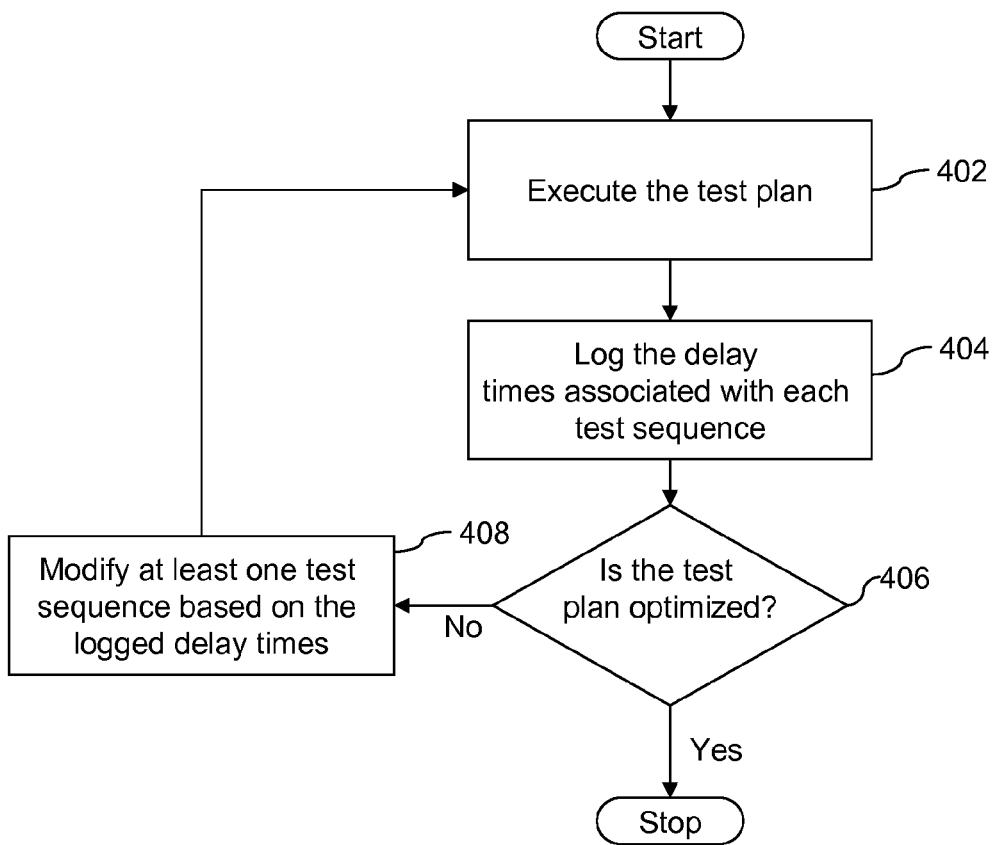
FIG. 4 is a flowchart illustrating a method for optimizing a test plan of an IC, in accordance with an embodiment of the present invention.

FIG. 4 is a flowchart illustrating a method for optimizing a test plan of an IC, in accordance with an embodiment of the invention. At step 402, the test plan is executed.

In various embodiments of the invention, the test plan includes various test sequences. The execution of a test sequence has been explained in detail in conjunction with FIGS. 1 and 2.

At step 404, the delay time associated with each test sequence is logged. In various embodiments of the invention, the delay times logged may be used to determine whether the test plan has been optimized. The delay times may be used to modify the test sequences, such that the test plan is optimized.

At step 406, a check is performed to determine whether the test plan has been optimized. In various embodiments of the invention, the test plan developer may decide whether the test plan has been optimized, based on the overall delay time associated with the test plan. The overall delay time associated with the test plan is the sum the delay times associated with the test sequences. If it is determined that the test plan has not been optimized at step 406, step 408 is performed. At step 408, at least one test sequence is modified, based on the delay times logged. If it is determined that the test plan has not has been optimized at step 406 the process is stopped.

In various embodiments of the invention, a test plan developer may choose to interchange activities between two test sequences, such that the test plan is optimized. Interchanging activities may include replacing an activity in a test sequence with an activity from another test sequence.

Thereafter, steps 402 onwards are repeated iteratively, until the test plan is optimized. In various embodiments of the invention, the test plan, may be optimized if the overall delay time associated with it is a minimum value, based on a comparison of the overall delay times observed across iterations.

In an embodiment of the invention, the test plan may be optimized by iteratively repeating steps 402 onwards, over a single IC. In another embodiment of the invention, steps 402 onwards may be iteratively repeated over a batch of ICs while optimizing the test plan.

Figure 5A:
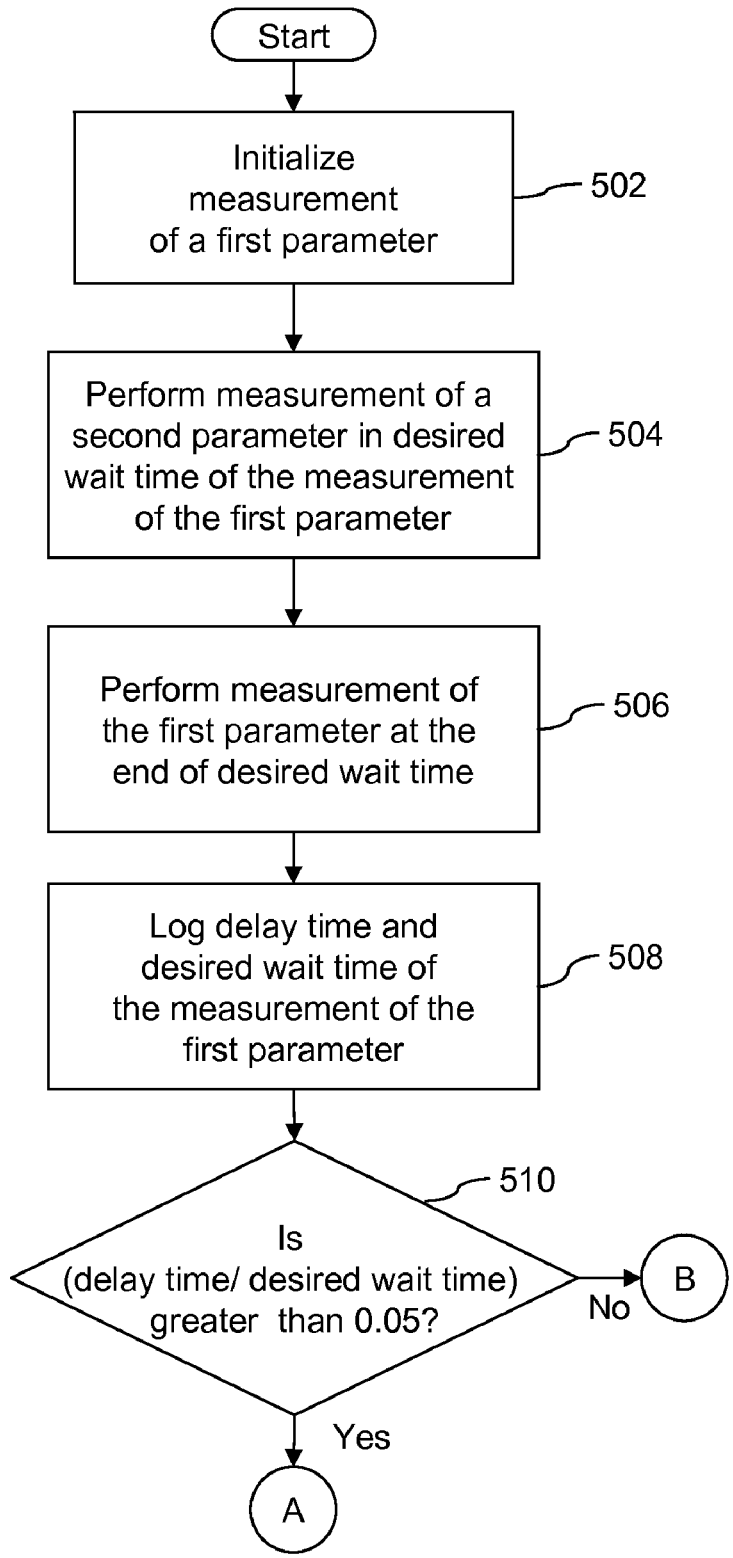
FIGS. 5A and 5B comprise a flowchart illustrating a method for modifying the measurement of a parameter, in accordance with an embodiment of the invention.
Figure 5B:
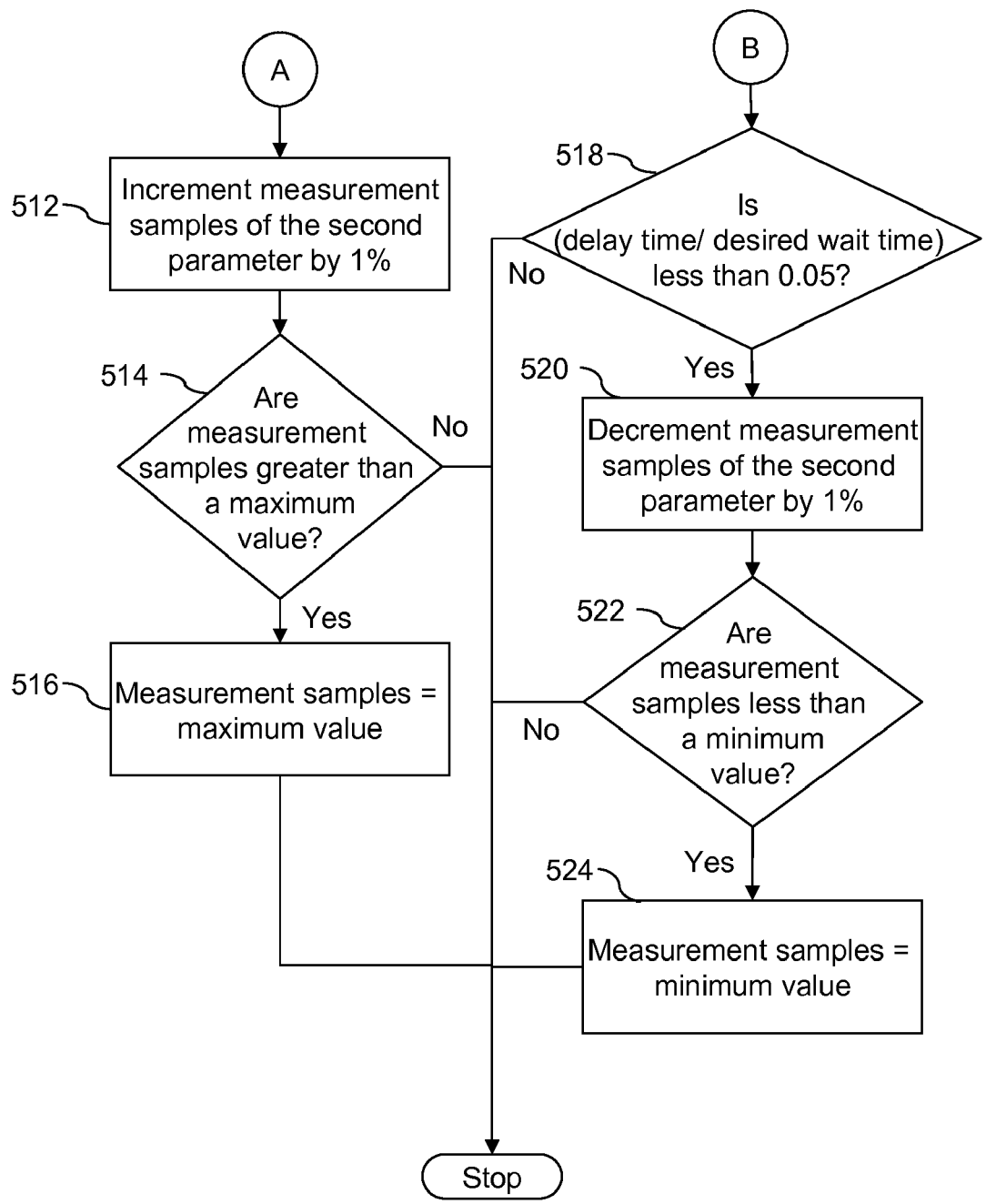

FIGS. 5A and 5B comprise a flowchart illustrating a method for modifying a measurement of a parameter, in accordance with an embodiment of the invention. At step 502, the measurement of a first parameter is initialized. In various embodiments of the invention, a desired wait time may be associated with the measurement of the first parameter. At step 504, the measurement of a second parameter is performed during the desired wait time. At step 506, the measurement of the first parameter is performed at the end of the desired wait time.

At step 508, the delay time and the desired wait time is logged. In various embodiments of the invention, the delay time may be equal to the difference between the desired wait time and the time that has elapsed in performing the measurement of the second parameter. At step 510, a check is performed to determine whether the ratio of the delay time to the desired wait time is greater than 5 percent. If the ratio of the delay time to the desired wait time is greater than 5 percent, step 512 is performed.

At step 512, the number of measurement samples of the second parameter is increased by 1 percent. At step 514, a check is performed to determine whether the increased number of measurement samples of the second parameter is greater than a maximum value. If the increased number of measurement samples of the second parameter is not greater than the maximum value, the process is stopped. If the increased number of measurement samples of the second parameter is greater than the maximum value at step 514, step 516 is performed. At step 516, the number of measurement samples is changed to the maximum value.

If it is determined at step 510 that the ratio of the delay time to the desired wait time is not greater than 5 percent, step 518 is performed. At step 518, a check is performed to determine whether the ratio of the delay time to the desired wait time is less than 5 percent. If the ratio of the delay time to the desired wait time is not less than 5 percent at step 518, the process is stopped. If the ratio of the delay time to the desired wait time is less than 5 percent, step 520 is performed. At step 520, the number of measurement samples of the second parameter is decreased by 1 percent. At step 522, a check is performed to determine whether the decreased number of measurement samples of the second parameter is less than a minimum value. If the decreased number measurement samples of the second parameter are not less than the minimum value, the process is stopped. If the decreased number measurement samples of the second parameter are less than the minimum value, step 524 is performed. At step 524, the number of measurement samples is changed to the minimum value.

In various embodiments of the invention, at steps 510 and 518, the ratio of the delay time to the desired wait time may be compared with a predetermined value. The predetermined value may be chosen by a test plan developer. Thereafter, the number of measurement samples of the second parameter may be increased or decreased by an amount equal to another predetermined value. The increments and decrements are by way of example only, other values may be used depending on the requirements of the testing regime.

In various embodiments of the invention, various attributes of an activity may be adjusted. The number of measurement samples of a parameter of an IC may be modified. Further, the resolution of a measurement instrument may be adjusted. Also, the delay time associated with an activity may be modified. These adjustments may be performed by a test plan developer or may be executed automatically by test software.

In various embodiments of the invention, the modified number of measurement samples may be logged and employed while executing the test plan for another IC. As a result, a batch of ICs may be tested using different numbers of measurement samples, measurement instrument resolutions, or delay times.

In various embodiments of the invention, a test plan developer may ensure that the adjustments made to various attributes of an activity do not compromise the reliability of the test results.

In various embodiments of the present invention, automated test software may execute the method for modifying measurements. In an embodiment of the invention, the maximum value and the minimum value may be chosen by a test plan developer. In another embodiment of the invention, the maximum and minimum value may be chosen automatically by test software, based on the nature of the IC and the test plan, the number of ICs to be tested, and the like.

Figure 6:
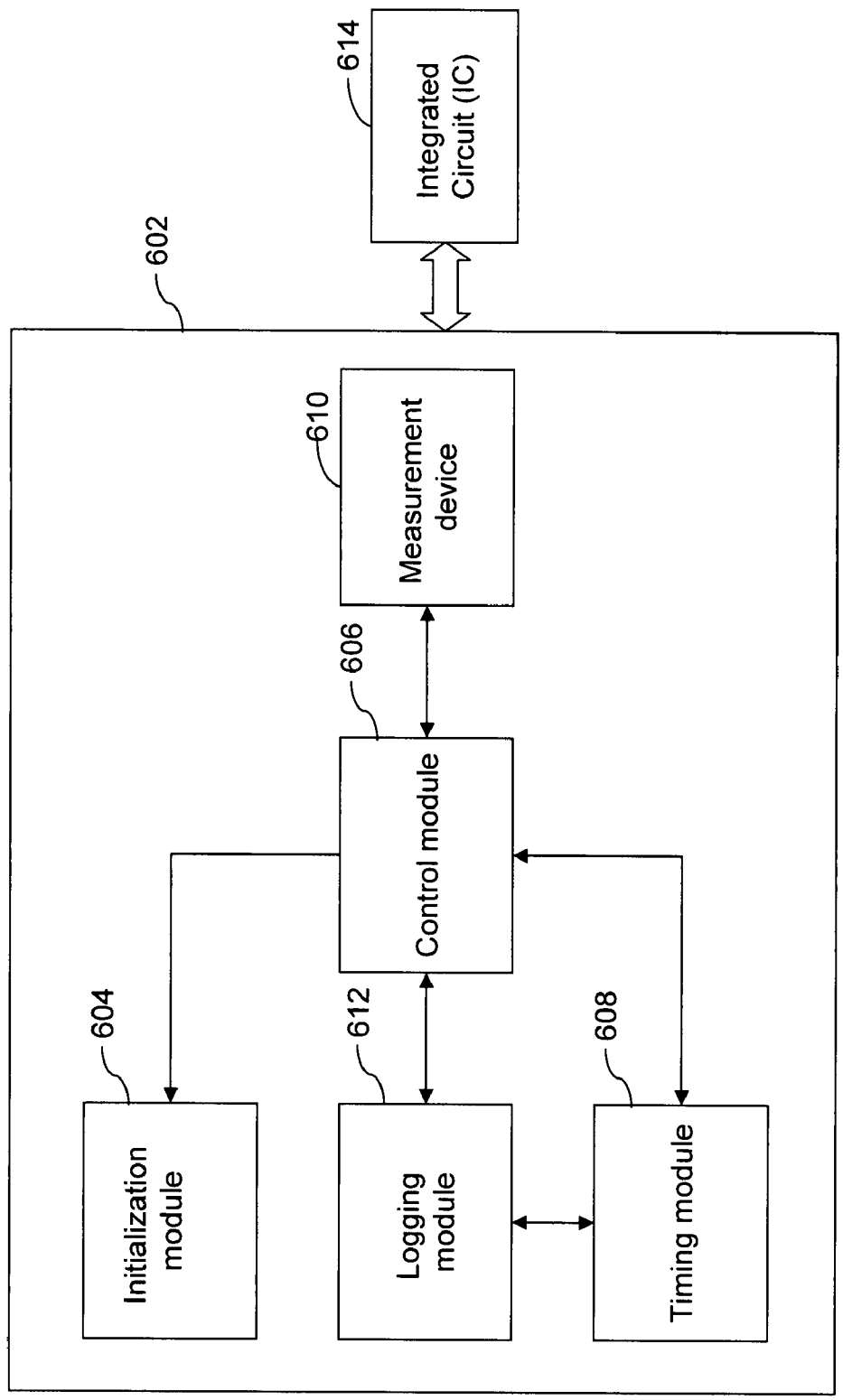
FIG. 6 is a block diagram of a test system for testing an IC, in accordance with an embodiment of the invention.

FIG. 6 is a block diagram of a test system 602 for testing an IC 614, in accordance with an embodiment of the invention. Test system 602 includes an initialization module 604, a control module 606, a timing module 608, a measurement instrument 610, and a logging module 612.

Initialization module 604 initializes the measurement of a parameter of IC 614. In various embodiments of the invention, initializing the measurement of the parameter may include changing the bias voltage of a pin of IC 614, changing the frequency of a Phase Locked Loop (PLL) within IC 614, initializing measurement instrument 610, and the like.

Control module 606 triggers initialization module 604 to initialize the measurement of a parameter of IC 614. In various embodiments of the invention, a desired wait may be associated with the measurement of the parameter.

Control module 606 further controls one or more activities that may be performed during the desired wait time. In various embodiments of the invention, controlling one or more activities may include controlling the measurements of parameters of IC 614, configuring measurement instrument 610, transferring data between IC 614 and a host computer, transferring data between measurement instrument 610 and the host computer, processing the data on the host computer or performing another test sequence on IC 614.

Timing module 608 determines the time that has elapsed in performing the one or more activities. Timing module 608 further calculates a delay time associated with a test sequence, i.e., the difference between the desired wait time and the time that has elapsed in performing the one or more activities.

Measurement instrument 610 performs the measurement of the parameter of IC 614. In various embodiments of the invention, measurement instrument 610 may be an RF power measurement instrument, a voltmeter, an ammeter, a digitizer, and the like. Logging module 612 logs the desired wait time, the time that has elapsed in performing the one or more activities and the delay time.

In an embodiment of the present invention, test system 602 may be integrated inside IC 614, making IC 614 capable of performing a self-test.

Figure 7:
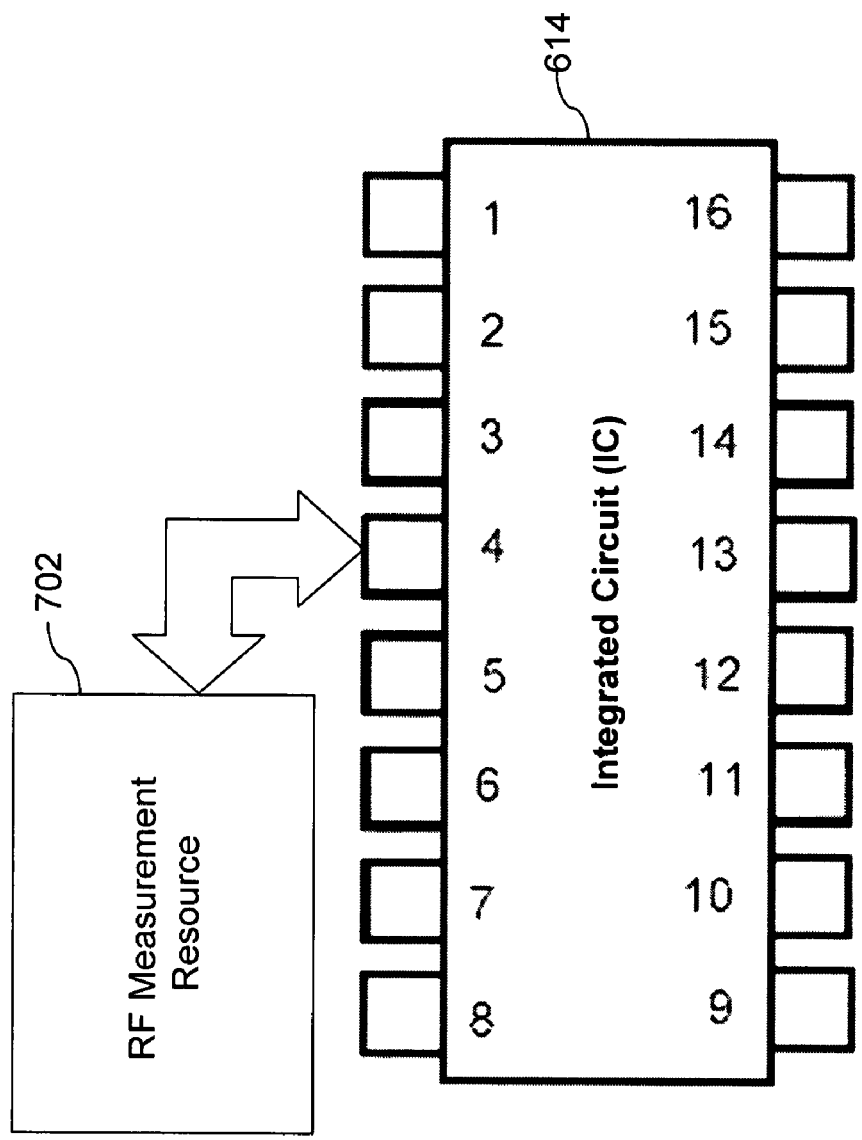
FIG. 7 is a pin layout of an IC, used as a device under test (DUT), in accordance with an exemplary embodiment of the invention.

FIG. 7 is a pin layout of IC 614, used as a Device under test (DUT), in accordance with an exemplary embodiment of the invention.

TABLE 1

A test sequence 1 that is performed on IC 614 is illustrated in the following table:

| Test Sequence 1 | Execution Time |
|---|---|
| 1) Set bias voltage on PIN 1 of IC 614 | 0 ms |
| 2) Introduce first delay time corresponding to first desired wait time for bias stabilization | 3 ms |
| 3) Measure bias voltage on PIN 1 (200 samples every 20 μs) | 4 ms |
| 4) Configure RF Measurement Instrument 702 | 0 ms |
| 5) Introduce second delay time corresponding to second desired wait time for RF Measurement Instrument 702 | 30 ms |
| 6) Measure RF Power on PIN 4 | 10 ms |
| Total time for executing test sequence 1 | 47 ms |

At step 1, a bias voltage is set on PIN 1 of IC 614. The bias voltage has a first desired wait time of 3 milli-seconds (ms), which is required for it to stabilize.

As a result, a first delay time of 3 ms is executed at step 2. At step 3, the measurement of the bias voltage is performed on PIN 1. Two hundred samples of the bias voltage are measured at time intervals of 20 micro-seconds (μs) each. The time taken for the measurement is therefore 4 ms.

At step 4, RF Measurement Instrument 702 is configured. RF Measurement Instrument 702 has a second desired wait time of 30 ms for stabilization. Therefore, a second delay time of 30 ms is executed at step 5. At step 6, RF Measurement Instrument 702 performs a measurement of RF Power on PIN 4. The time taken for the measurement is about 10 ms.

As shown in Table 1, the total time taken to execute test sequence 1 on IC 614 is 47 ms.

The total time may be reduced by utilizing the second delay time of 30 ms. One or more other activities may be performed during the second delay time. Therefore, test sequence 1 may be modified for utilization of the second delay time, as illustrated in Table 2 below:

TABLE 2

| Test Sequence 2 | Execution Time |
|---|---|
| 1) Set bias voltage on PIN 1 of IC 614 | 0 ms |
| 2) Configure RF Measurement Instrument 702 | 0 ms |
| 3) Start a timer | 0 ms |
| 4) Introduce first delay time corresponding to first desired wait time for bias stabilization | 3 ms |
| 5) Measure bias voltage on PIN 1 (200 samples every 20 μs) | 4 ms |
| 6) Calculate and introduce a second delay time = (second desired wait time − elapsed time) | 23 ms |
| 7) Measure RF Power on PIN 4 | 10 ms |
| Total time for executing test sequence 1 | 40 ms |

At step 1, a bias voltage is set on PIN 1 of IC 614. At step 2, RF Measurement Instrument 702 is configured. RF Measurement Instrument 702 has a second desired wait time of 30 ms, for stabilization. At step 3, a timer is initialized, which times each step in test sequence 2. At step 4, a first delay time of 3 ms is executed, corresponding to a first desired wait time for bias voltage stabilization. At step 5, measurement of the bias voltage is performed on PIN 1. Two hundred samples of the bias voltage are measured at time intervals of 20 μs each. Therefore, the time taken to measure the bias voltage is 4 ms. At step 6, a second delay time is calculated and a delay with time period corresponding to the second delay time is executed. The second delay time is equal to the difference between the second desired wait time and the time that has elapsed in executing steps 3 to 6, which is 23 ms. At step 7, RF Measurement Instrument 702 performs a measurement of RF Power on PIN 4. The time taken to perform the measurement is 10 ms.

The total time for executing test sequence 2 is 40 ms. Thereby, test sequence 2 achieves a 15 percent reduction in time over test sequence 1, since the second desired wait time of 30 ms is partially utilized to perform one or more activities. Further, in test sequence 2, a test plan developer may choose to insert one or more other activities during the second delay time, which is positive. Therefore, the overall test time may be further reduced. However, in accordance with test sequence 2, the test plan developer may choose to remove an activity from the test sequence if the second delay time calculated at step 6 is negative.

In accordance with another embodiment of test sequence 2, the number of measurement samples of the bias voltage may be adjusted, based on the ratio of the second delay time to the second desired wait time. If the ratio is greater that 5 percent, the number of measurement samples of the bias voltage may be increased by 1 percent. If the ratio is less than 5 percent, the number of measurement samples of the bias voltage may be decreased by 1 percent. Subsequent ICs in a test batch may be tested with the adjusted number of measurement samples. Therefore, repeating test sequence 2 over a definite number of ICs achieves reliable test results.

In various embodiments of the invention, various attributes of an activity may be adjusted. For example, the resolution of a measurement instrument may be adjusted. Also, the delay time associated with an activity may be modified. These adjustments may be performed by a test plan developer or may be executed automatically by test software.

Further, in various embodiments of the invention, one or more test sequences may be inserted or interwoven with test sequence 2, to optimize a test plan of IC 614. A test sequence may include at least one timer for timing one or more activities performed in the desired wait times associated with measurements in the test sequence. Moreover, the at least one timer may be used to time specific activities associated with more than one test sequence, to optimize the time taken to test IC 614.

Various embodiments of the invention have a number of advantages. The optimized test plan considerably reduces the test time of an IC by performing one or more activities during the desired wait time associated with the measurement of a parameter of the IC, thereby utilizing the delay time associated with the measurement.

The method and system of the invention include logging the time taken for testing and the delay times corresponding to the test sequences. As a result, the logged information may be compared to determine an optimized test plan as well as an optimized test sequence for the IC.

Further, executing an optimized test plan, according to various embodiments of the invention, over a batch of ICs significantly reduces the total test time for the batch. Moreover, a test plan developer may ensure adequate accuracy in the measurements to provide highly reliable test results by modifying various attributes of an activity.

The system, as described in the present invention or any of its components, may be embodied in the form of a computer system. Typical examples of a computer system includes a general-purpose computer, a programmed microprocessor, a micro-controller, a peripheral integrated circuit element, and other devices or arrangements of devices that are capable of implementing the method of the present invention.

The computer system includes a computer, an input device, a display unit, and the Internet. The computer can incorporate a microprocessor. The microprocessor can be connected to a communication bus. The computer can also include a memory. The memory may include Random Access Memory (RAM) and/or Read Only Memory (ROM). The computer system can further incorporate a storage device. The storage device can include a hard disk drive or a removable storage drive, such as a floppy disk drive and/or an optical disk drive. Storage device can also be other similar device for loading computer programs or other instructions into the computer system.

The computer system executes a set of instructions that are stored in one or more storage elements, in order to process input data. The storage elements may also hold data or other information as required. The storage element may be in the form of an information source or a physical memory element present in the processing machine.

The set of instructions may include various commands that instruct the processing machine to perform specific tasks such as the method of the present invention. The set of instructions may be in the form of a software program. The software may be in various forms such as system software or application software like, but not limited to, Microsoft© Visual Basic, Cadence (a proprietary programming language developed by LTX Corporation), C, C++, TCL and Java. Further, the software might be in the form of a collection of separate programs, a program module with a larger program or a portion of a program module. The software might also include modular programming in the form of object-oriented programming. The processing of input data by the processing machine may be in response to user commands, or in response to results of previous processing or in response to a request made by another processing machine.

The term logic may include, by way of example, software or hardware and/or combinations of software and hardware.

While the foregoing is directed to embodiments of the present invention, other and further embodiments of the invention may be devised, without departing from the basic scope thereof, the scope thereof being determined by the following claims.

What is claimed is:

1. A method for executing a test sequence for testing an integrated circuit, the test sequence comprising measurement of at least one parameter of the integrated circuit, the method comprising:
   a) initializing the measurement of the at least one parameter, the measurement having a desired wait time;
   b) performing one or more activities during the desired wait time;
   c) performing the measurement of the at least one parameter at the end of the desired wait time; and
   d) modifying the test sequence based on at least one of the desired wait time, and the difference between the desired wait time and the time elapsed in performing the one or more activities.

2. The method according to claim 1, wherein modifying the test sequence includes inserting one or more other activities in the test sequence.

3. The method according to claim 1, wherein modifying the test sequence includes removing at least one of the one or more activities from the test sequence.

4. The method according to claim 1, wherein modifying the test sequence includes modifying one or more attributes of at least one of the one or more activities performed during the desired wait time.

5. The method according to claim 1, wherein the one or more activities comprises at least one of measuring one or more other parameters of the integrated circuit, transferring data between at least two of the integrated circuit, a measurement instrument and a host computer, processing the data on the host computer, configuring the measurement instrument, executing another test sequence and introducing a delay having a time period equal to the desired wait time.

6. The method according to claim 1, wherein the method is implemented as a computer readable program code comprising a set of instructions for executing a test sequence for testing an integrated circuit embodied in a computer usable medium, wherein the set of instructions are executed by a microprocessor.

7. The method according to claim 1 further comprising logging at least one of the desired wait time, the time elapsed in performing the one or more activities, and the difference between the desired wait time and the time elapsed in performing the one or more activities.

8. The method according to claim 1 further comprising modifying the measurement of the at least one parameter based on the desired wait time, and the difference between the desired wait time and the time elapsed in performing the one or more activities.

* * * * *